United States Patent
Lin et al.

(10) Patent No.: US 12,283,611 B2
(45) Date of Patent: *Apr. 22, 2025

(54) SEMICONDUCTOR STRUCTURE

(71) Applicant: GlobalWafers Co., Ltd., Hsinchu (TW)

(72) Inventors: Po Jung Lin, Hsinchu (TW); Tzu-Yao Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 468 days.

This patent is subject to a terminal disclaimer.

(21) Appl. No.: 17/824,910

(22) Filed: May 26, 2022

(65) Prior Publication Data

US 2023/0045328 A1    Feb. 9, 2023

(30) Foreign Application Priority Data

Aug. 9, 2021  (TW) ................. 110129313

(51) Int. Cl.
*H01L 29/20* (2006.01)
*H01L 21/02* (2006.01)

(52) U.S. Cl.
CPC .... *H01L 29/2003* (2013.01); *H01L 21/02145* (2013.01); *H01L 21/0254* (2013.01)

(58) Field of Classification Search
None
See application file for complete search history.

(56) References Cited

U.S. PATENT DOCUMENTS

| | | |
|---|---|---|
| 7,247,889 B2 | 7/2007 | Hanson et al. |
| 9,761,672 B1 | 9/2017 | Nelson et al. |
| 2017/0069716 A1 | 3/2017 | Roberts et al. |
| 2017/0069720 A1* | 3/2017 | Roberts ............ H01L 21/266 |
| 2021/0083086 A1* | 3/2021 | Huang ............ H01L 21/28581 |

FOREIGN PATENT DOCUMENTS

TW       201603313      1/2016

* cited by examiner

*Primary Examiner* — Michelle Mandala
*Assistant Examiner* — Jordan M Klein
(74) *Attorney, Agent, or Firm* — JCIPRNET

(57) ABSTRACT

A semiconductor structure includes a substrate, a first nitride layer, a second nitride layer, a third nitride layer, and a polarity inversion layer. The first nitride layer is formed on the substrate, and the polarity inversion layer formed at a surface of the first nitride layer converts a non-metallic polar surface of the first nitride layer into a metallic polar surface of the polarity inversion layer. The second nitride layer is formed on the polarity inversion layer. The third nitride layer is formed on the second nitride layer.

18 Claims, 5 Drawing Sheets

SEMICONDUCTOR STRUCTURE

CROSS-REFERENCE TO RELATED APPLICATION

This application claims the priority benefit of Taiwanese application serial no. 110129313, filed on Aug. 9, 2021. The entirety of the above-mentioned patent application is hereby incorporated by reference herein and made a part of this specification.

BACKGROUND OF THE INVENTION

Field of the Invention

The invention relates to a semiconductor structure, and in particular to a semiconductor structure having a polarity inversion layer.

Description of Related Art

Gallium nitride (GaN) has advantages such as higher frequency and output power, and therefore has been widely used in the field of semiconductor epitaxy.

Currently, in order to reduce insertion loss and block the generation of parasitic channels, a silicon nitride layer is added to the GaN on Si semiconductor structure. However, the presence of the silicon nitride layer readily causes the issue that a flat GaN epitaxy layer may not be grown.

SUMMARY OF THE INVENTION

The invention provides a semiconductor structure that may grow III-V group semiconductor materials with a flat surface while reducing insertion loss, avoiding surface deterioration, and blocking parasitic channels.

A semiconductor structure includes a substrate, a first nitride layer, a second nitride layer, a third nitride layer, and a polarity inversion layer. The first nitride layer is formed on the substrate, and the polarity inversion layer formed at a surface of the first nitride layer converts a non-metallic polar surface of the first nitride layer into a metallic polar surface of the polarity inversion layer. The second nitride layer is formed on the polarity inversion layer. The third nitride layer is formed on the second nitride layer.

In an embodiment of the invention, a thickness of the polarity inversion layer is less than 1 nm.

In an embodiment of the invention, a material of the polarity inversion layer includes silicon or a metal.

In an embodiment of the invention, the first nitride layer is $Al_{1-x}Si_xN$, and $0<x\leq1$.

In an embodiment of the invention, an aluminum content in the first nitride layer is gradually increased from the substrate to the polarity inversion layer.

In an embodiment of the invention, a thickness of the first nitride layer is between 0.1 nm and 5 nm.

In an embodiment of the invention, a surface roughness of the first nitride layer is Rms<0.6 nm.

In an embodiment of the invention, the second nitride layer is a single-layer or multi-layer AlN.

In an embodiment of the invention, the multi-layer AlN includes a low-temperature aluminum nitride layer formed on the polarity inversion layer and a high-temperature aluminum nitride layer between the low-temperature aluminum nitride layer and the third nitride layer, and a temperature difference between a growth temperature of the high-temperature aluminum nitride layer and a growth temperature of the low-temperature aluminum nitride layer is greater than 50° C.

In an embodiment of the invention, a thickness of the second nitride layer is 100 nm or less, and a thickness of the low-temperature aluminum nitride layer is less than a thickness of the high-temperature aluminum nitride layer.

In an embodiment of the invention, the third nitride layer includes a multi-layer structure.

In an embodiment of the invention, the third nitride layer includes all combinations of $Al_{1-z}Ga_zN$ and AlN and GaN, and $0<z\leq1$.

In an embodiment of the invention, the third nitride layer includes: a superlattice structure, a graded layer structure, an insertion layer structure, or a combination of the above structures.

In an embodiment of the invention, a thickness of the third nitride layer is between 0.1 μm and 10 μm.

In an embodiment of the invention, a carrier concentration in a surface of the substrate is $10^{15}/cm^3$ or less.

In an embodiment of the invention, a carrier diffusion depth in the surface of the substrate is less than 0.5 μm.

In an embodiment of the invention, an insertion loss generated in the semiconductor structure is less than −0.5 dB.

In an embodiment of the invention, the substrate has a resistivity of 1,000 ohm-cm to 10,000 ohm-cm.

Based on the above, in the invention, the polarity inversion layer is used in the semiconductor structure to convert the non-metallic polar surface of the first nitride layer into the metallic polar surface of the polarity inversion layer, which is conductive to the flatness of the second nitride layer and the third nitride layer to be grown subsequently. If the first nitride layer is an aluminum-containing nitride layer, the change of the aluminum concentration may be adjusted to avoid surface deterioration and block the generation of parasitic channels. In addition, the second nitride layer formed by the low-temperature aluminum nitride layer and the high-temperature aluminum nitride layer may suppress interface carrier concentration and reduce insertion loss.

In order to make the aforementioned features and advantages of the disclosure more comprehensible, embodiments accompanied with figures are described in detail below.

DESCRIPTION OF THE EMBODIMENTS

Figure 1:
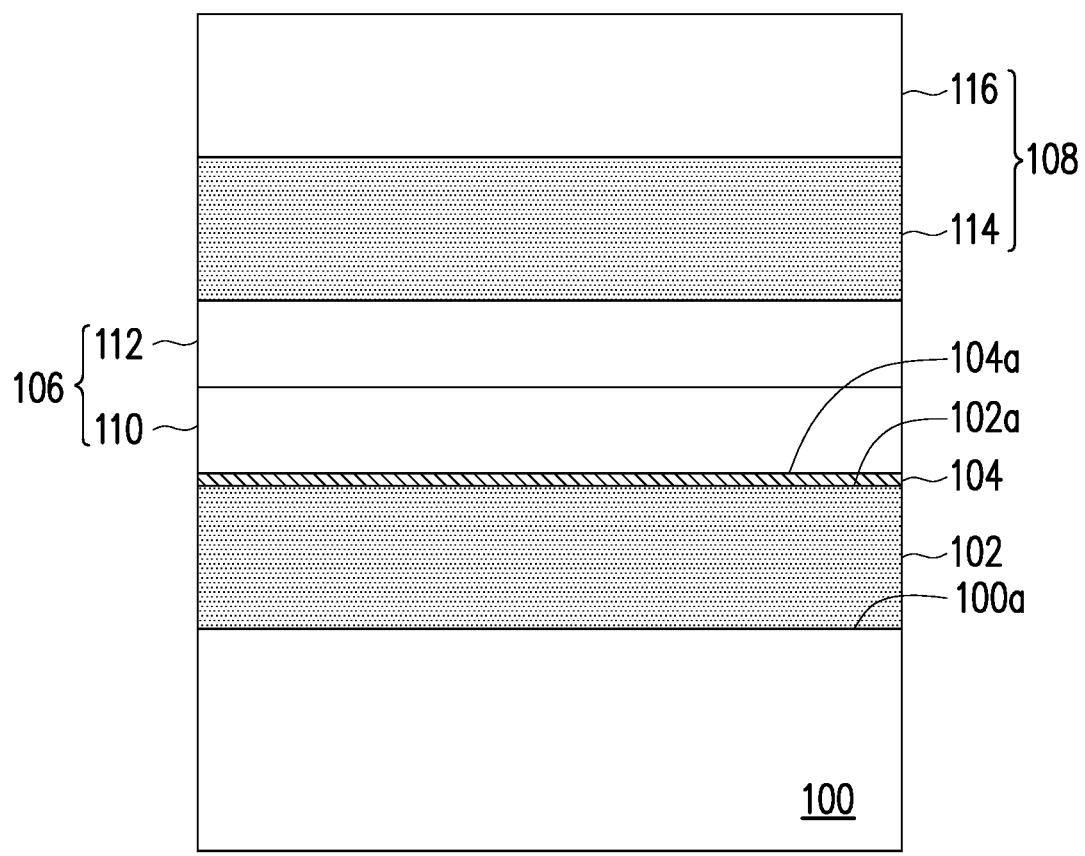
FIG. 1 is a schematic cross-sectional view of a semiconductor structure according to an embodiment of the invention.

In the following, exemplary embodiments of the invention are comprehensively described with reference to figures, but the invention may also be implemented in various different forms and should not be construed as limited to the embodiments of the specification. In the figures, for clarity, the size and thickness of each region, portion, and each film layer do not need to be shown to actual scale. For ease of explanation, the same elements below are provided with the same reference numerals.

FIG. 1 is a schematic cross-sectional view of a semiconductor structure according to an embodiment of the invention.

Figure 2:
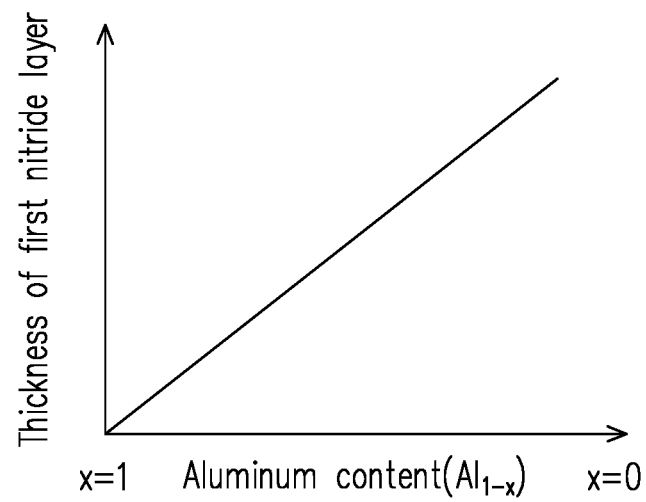
FIG. 2 is a graph showing the aluminum content of the first nitride layer in the semiconductor structure of the embodiment.

Referring to FIG. 1, a semiconductor structure of the present embodiment includes a substrate 100, a first nitride layer 102, a polarity inversion layer 104, a second nitride layer 106, and a third nitride layer 108. In an embodiment, the substrate 100 is a silicon substrate, and the substrate 100 has a resistivity of 1,000 ohm-cm to 10,000 ohm-cm, preferably 3,000 ohm-cm to 7,500 ohm-cm. The first nitride layer 102 is formed on the substrate 100, wherein the thickness of the first nitride layer is between 0.1 nm and 5 nm, preferably between 1 nm and 3 nm. From the viewpoint of blocking the generation of parasitic channels and flattening the surface of the semiconductor structure, the first nitride layer 102 may be aluminum silicon nitride $Al_{1-x}Si_xN$ (0<x≤1), and the aluminum content in the first nitride layer 102 is gradually increased from the substrate 100 to the polarity inversion layer 104, as shown in FIG. 2. In FIG. 2, the first nitride layer 102 is $Al_{1-x}Si_xN$ as an example, and therefore the aluminum content is varied from low (x is equal to 1 or close to 1) to high (x is equal to 0 or close to 0), and a portion with low aluminum content is close to the substrate 100, and a portion with high aluminum content is close to the polarity inversion layer 104. Therefore, a surface roughness Rms of the first nitride layer 102 may be less than 0.6 nm, preferably Rms<0.4 nm, such as 0.3 nm, 0.2 nm, and the like.

Referring further to FIG. 1, the polarity inversion layer 104 is formed at a surface 102a of the first nitride layer 102, and may convert the non-metallic polar surface 102a of the first nitride layer 102 into a metallic polar surface 104a of the polarity inversion layer 104, wherein the thickness of the polarity inversion layer 104 is less than about 1 nm, preferably less than 0.8 nm, such as 0.7 nm, 0.6 nm, 0.5 nm, 0.4 nm, and the like. Since the polarity inversion layer 104 has the ability to convert the non-metallic polar surface 102a into the metallic polar surface 104a, the surface flatness of the subsequently-grown nitride layer may be facilitated, and the manufacturing method of the polarity inversion layer 104 may be, but not limited to, chemical vapor deposition (CVD) or physical vapor deposition (PVD), such as an epitaxy process such as metal organic chemical vapor deposition (MOCVD). In an embodiment, the material of the polarity inversion layer 104 is metal, such as aluminum, indium, gallium, etc.; in another embodiment, the material of the polarity inversion layer 104 is silicon. In other words, the polarity inversion layer 104 may convert the non-metallic polar surface 102a (N-surface) into a metallic polar surface 104a (e.g., Al-surface, In-surface, Ga-surface, or Si-surface), and is beneficial to the surface flatness of the semiconductor structure.

In FIG. 1, the second nitride layer 106 is formed on the polarity inversion layer 104, and the third nitride layer 108 is formed on the second nitride layer 106. In an embodiment, the second nitride layer 106 may be a single-layer or multi-layer AlN. For example, the second nitride layer 106 of FIG. 1 is a double-layer structure, and from the viewpoint of suppressing insertion loss and interface carrier concentration, the second nitride layer 106 is preferably a double-layer structure of the low-temperature aluminum nitride (LT AlN) layer 110 and the high-temperature aluminum nitride (HT AlN) layer 112, wherein the low-temperature aluminum nitride layer 110 is formed on the polarity inversion layer 104, and the high-temperature aluminum nitride layer 112 is located between the low-temperature aluminum nitride layer 110 and the third nitride layer 108. The temperature difference between the growth temperature of the high-temperature aluminum nitride layer 112 and the growth temperature of the low-temperature aluminum nitride layer 110 is greater than about 50° C., preferably greater than 100° C.

Figure 3:
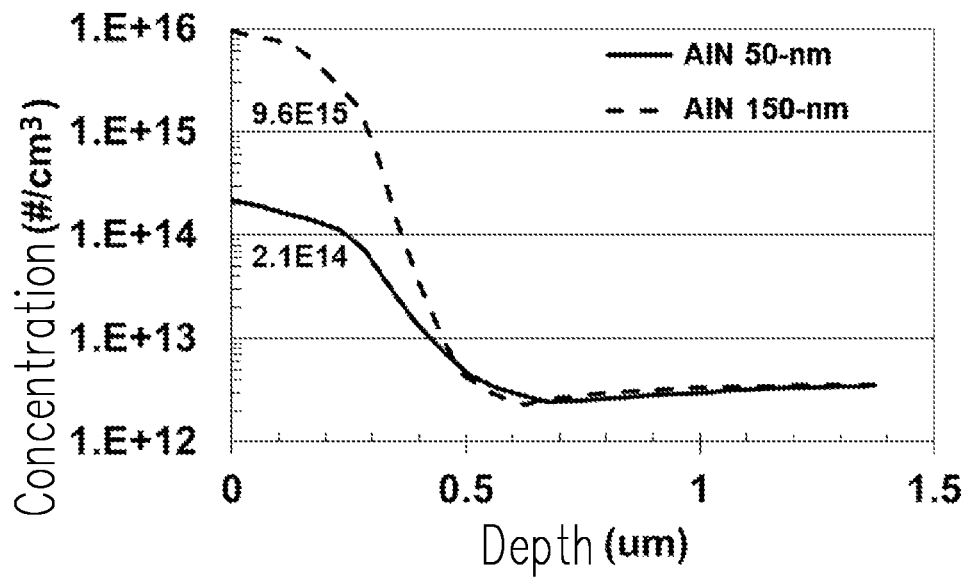
FIG. 3 is a graph showing the substrate carrier concentration and diffusion depth of a three-layer structure of high-resistance silicon substrate/aluminum silicon nitride layer/metal layer/high-temperature aluminum nitride layer.
Figure 4:
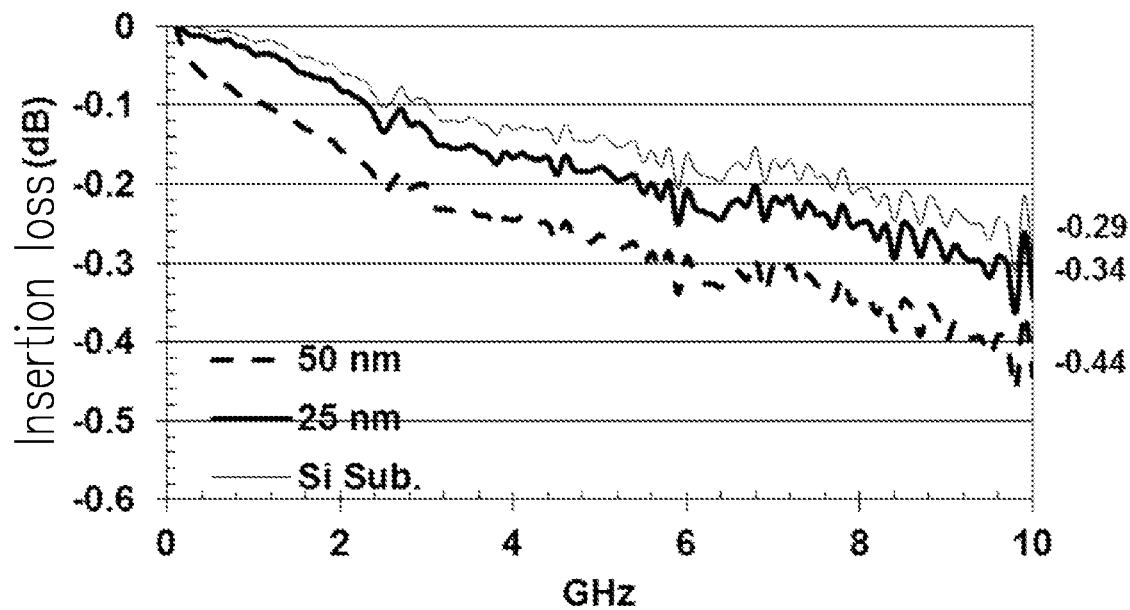
FIG. 4 is a graph of insertion loss generated in the overall semiconductor structure by different thickness combinations of the second nitride layers in the semiconductor structure of the embodiment.

In an embodiment, the thickness of the second nitride layer 106 is 100 nm or less, preferably 50 nm or less, for example, 25 nm or less. FIG. 3 is a test of a four-layer structure of high-resistance silicon substrate/aluminum nitride layer/metal layer/high-temperature aluminum nitride layer, wherein the high-resistance silicon substrate is opposite to the substrate 100, the aluminum nitride layer is opposite to the first nitride layer 102, the metal layer is opposite to the polarity inversion layer 104, and the high-temperature aluminum nitride layer is opposite to the second nitride layer 106. It may be seen from FIG. 3 that the thickness of the second nitride layer 106 affects the carrier concentration in the surface of the substrate 100, wherein the carrier concentration of the aluminum nitride layer (AlN) with a thickness of 150 nm, $9.6E15/cm^3$, is significantly greater than that of the aluminum nitride layer with a thickness of 50 nm, $2.1E14/cm^3$, and therefore the thickness of the second nitride layer is less than or equal to 50 nm to achieve good effects. In another embodiment, if the second nitride layer 106 is a double-layer structure of the low-temperature aluminum nitride layer 110 and the high-temperature aluminum nitride layer 112, the crystallinity of the low-temperature aluminum nitride layer 110 is worse. Therefore, it is preferable to grow the low-temperature aluminum nitride layer 110 first and then grow the high-temperature aluminum nitride layer 112 thereon. For the same reason, the thickness of the low-temperature aluminum nitride layer 110 is preferably less than the thickness of the high-temperature aluminum nitride layer 112, wherein the thickness of the low-temperature aluminum nitride layer 110 is, for example, between 1 nm and 50 nm, preferably between 5 nm and 25 nm; the thickness of the high-temperature aluminum nitride layer 112 is, for example, between 1 nm and 50 nm, preferably between 10 nm and 35 nm. For example, FIG. 4 is a graph of the insertion loss generated in the overall semiconductor structure of the second nitride layer 106 with two thickness combinations. The thickness of the second nitride layer 106 is 25 nm, which is a 10 nm low-temperature aluminum nitride layer 110 plus a 15 nm high-temperature aluminum nitride layer 112, wherein the thickness of the low-temperature aluminum nitride layer 110 is less than that of the high-temperature aluminum nitride layer 112; the thickness of the second nitride layer is 50 nm, which is a 20 nm low-temperature aluminum nitride layer 110 plus a 30 nm high-temperature aluminum nitride layer 112, wherein the thickness of the low-temperature aluminum nitride layer 110 is less than that of the high-temperature aluminum nitride layer 112. Other film layers in the semiconductor structure are an aluminum silicon nitride layer (the first nitride layer 102), an aluminum layer with a thickness less than 1 nm (the polarity inversion layer 104), and the third nitride layer 108 formed by an AlGaN layer with a thickness of 300 nm and a uGaN layer with a thickness of 600 nm. It may be known from FIG. 4 that the insertion loss of the high-resistance silicon substrate (Si Sub.) is about −0.29 dB, the insertion loss of the second nitride layer 106 is about −0.34 dB at 25 nm, and the insertion loss of the second nitride layer 106 is about −0.44 dB at 50 nm. Therefore, it is verified by experiments that the thickness of the second nitride layer 106 is 25 nm. That is, the less the thickness of the second nitride layer 106, and when the thickness of the low-temperature aluminum nitride layer 110 is less than that of the high-temperature aluminum nitride layer 112, the less the insertion loss.

Figure 5:
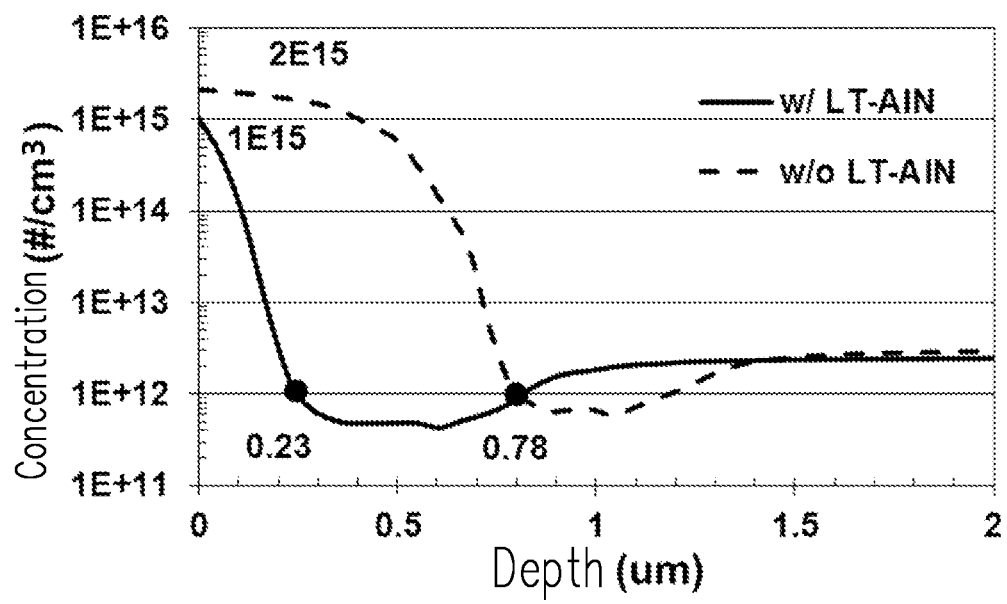
FIG. 5 is a graph showing the substrate carrier concentration and diffusion depth with and without a low-temperature aluminum nitride layer in the semiconductor structure of the embodiment.

The semiconductor structure used in the experiment of FIG. 5 includes a high-resistance silicon substrate, an aluminum-silicon nitride layer (the first nitride layer 102), an aluminum layer with a thickness less than 1 nm (the polarity inversion layer 104), the second nitride layer 106 formed by a low-temperature aluminum nitride (LT-AlN) layer with a thickness of 20 nm and a high-temperature aluminum nitride layer with a thickness of 30 nm, the third nitride layer 108 formed by an AlGaN layer with a thickness of 300 nm and a uGaN layer with a thickness of 600 nm, and the carrier diffusion depth in a surface 100$a$ of the substrate 100 may be less than 0.5 μm, preferably less than 0.4 μm, such as 0.23 μm (w/LT-AlN). However, under the same conditions, without the low-temperature aluminum nitride layer 110, the high-temperature aluminum nitride layer 112 with a thickness of 50 nm is used as the second nitride layer 106, and therefore the carrier concentration is about $2 \times 10^{15}/cm^3$, and the carrier diffusion depth is greater than 0.5 μm, such as 0.78 μm (w/o LT-AlN). Therefore, the double-layer structure formed by the low-temperature aluminum nitride layer 110 and the high-temperature aluminum nitride layer 112 may indeed more effectively suppress the interface carrier concentration in the surface 100$a$ of the substrate 100. Experiments have verified that due to the presence of the low-temperature aluminum nitride layer 110, the carrier concentration in the surface 100$a$ of the substrate 100 may be reduced to $10^{15}/cm^3$ or less and the carrier diffusion depth is less than 0.5 μm.

Figure 6:
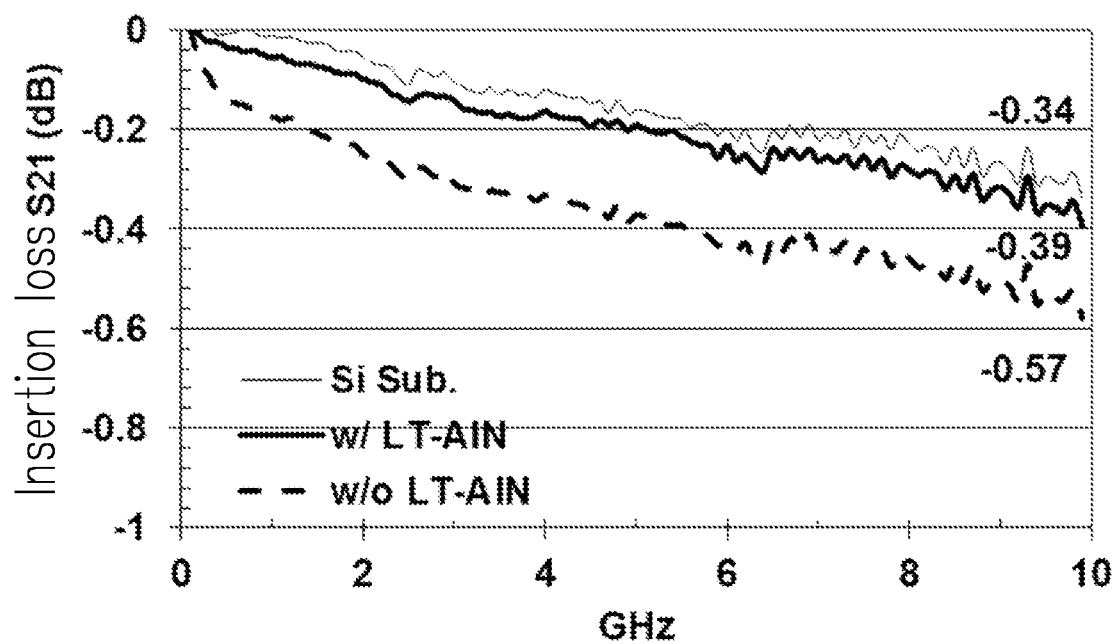
FIG. 6 is a graph of insertion loss generated in the overall semiconductor structure with and without a low-temperature aluminum nitride layer in the semiconductor structure of the embodiment.

In addition, the insertion loss generated in the semiconductor structure having the second nitride layer 106 may also be reduced to less than −0.5 dB, preferably less than −0.4 dB. It is experimentally verified that, as shown in FIG. 6, the insertion loss of the silicon substrate 100 is about −0.34 dB, and the insertion loss of the semiconductor structure having the second nitride layer 106 is about −0.39 dB. Therefore, the difference between the two insertion losses is about −0.05 dB, wherein the semiconductor structure used in the experiment of FIG. 6 is the same as that in the experiment of FIG. 5. Under the same conditions, the insertion loss of the semiconductor structure without the low-temperature aluminum nitride layer 110 is −0.57 dB, and therefore the difference from the insertion loss of the silicon substrate is about −0.23 dB, which is four times or more than −0.05 dB; that is to say, the double-layer structure formed by the low-temperature aluminum nitride layer 110 and the high-temperature aluminum nitride layer 112 may indeed reduce the insertion loss of the semiconductor structure more effectively.

Referring to FIG. 1 again, the third nitride layer 108 includes a multi-layer structure, and the thickness of the third nitride layer 108 is, for example, between 0.1 μm and 10 μm, preferably between 2 μm and 8 μm. Due to the presence of the polarity inversion layer 104, the surface flatness of the subsequently-grown nitride layer, such as the surface roughness Rms of the third nitride layer 108, may be less than 0.5 nm, preferably Rms<0.3 nm. Moreover, it is verified by experiments that the surface roughness Rms of the semiconductor structure having the polarity inversion layer 104 (as shown in FIG. 1) may be less than 0.5 nm, preferably 0.27 nm. However, under the same conditions, the surface roughness Rms of the semiconductor structure without the polarity inversion layer is as high as 40 nm, and therefore the polarity inversion layer 104 does have a great influence on the surface flatness of the subsequently-grown nitride layer.

In the present embodiment, the third nitride layer 108 includes all combinations of $Al_{1-z}Ga_zN$ and AlN and GaN, and $0 < z \leq 1$. For example, the third nitride layer 108 of FIG. 1 is a combination of the $Al_{1-z}Ga_zN$ layer 114 and the GaN layer 116, wherein the z value of the $Al_{1-z}Ga_zN$ layer 114 may be increased in steps or continuously from the second nitride layer 106 to the GaN layer 116. However, the invention is not limited thereto.

FIG. 7A, FIG. 7B, FIG. 7C, and FIG. 7D all only show third nitride layers 700$a$, 700$b$, 700$c$, and 700$d$, and the rest of the layers are as provided in FIG. 1 and are not repeated herein.

Figure 7A:
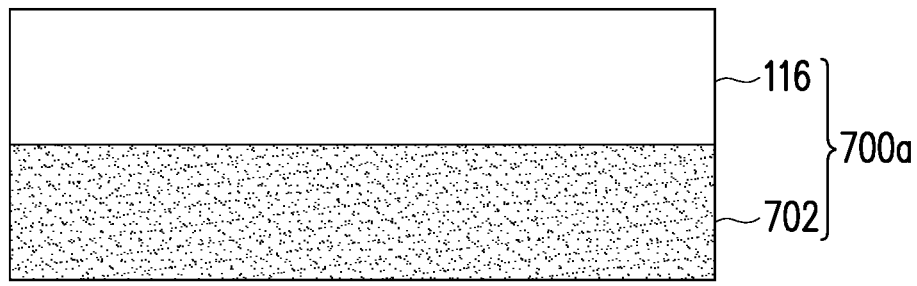
FIG. 7A is a schematic cross-sectional view of the first embodiment of the third nitride layer in the semiconductor structure of the embodiment.

In another embodiment, as shown in FIG. 7A, the third nitride layer 700$a$ may be a combination of an AlN layer 702 and the GaN layer 116.

Figure 7B:
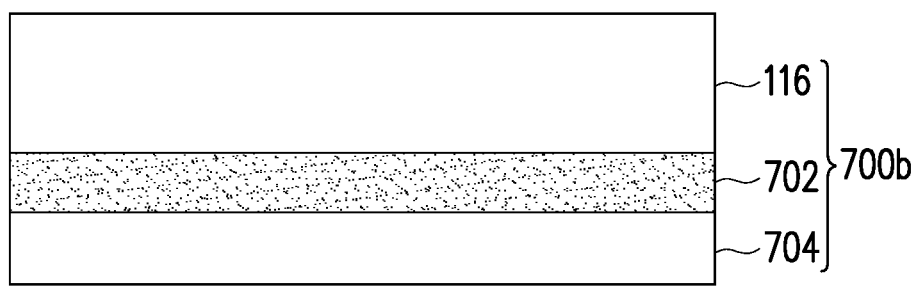
FIG. 7B is a schematic cross-sectional view of the second embodiment of the third nitride layer in the semiconductor structure of the embodiment.

In FIG. 7B, the third nitride layer 700$b$ is a three-layer structure of a GaN layer 704, the AlN layer 702, and the GaN layer 116.

Figure 7C:
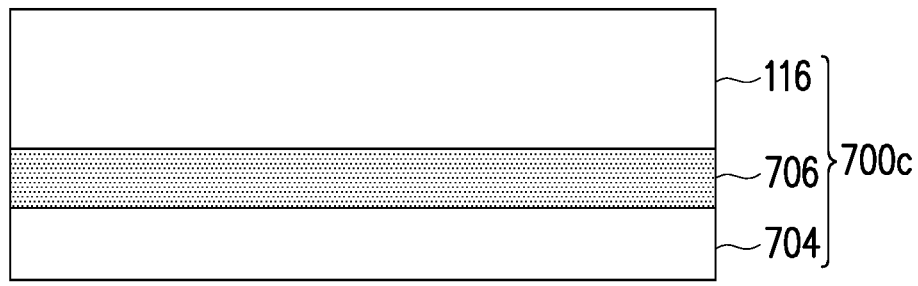
FIG. 7C is a schematic cross-sectional view of the third embodiment of the third nitride layer in the semiconductor structure of the embodiment.

In FIG. 7C, the third nitride layer 700$c$ is a three-layer structure of the GaN layer 704, a low-temperature AlN layer 706, and the GaN layer 116.

Figure 7D:
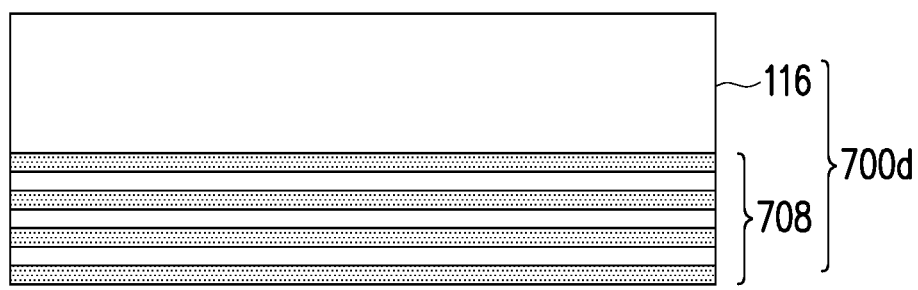
FIG. 7D is a schematic cross-sectional view of the fourth embodiment of the third nitride layer in the semiconductor structure of the embodiment.

In addition, the third nitride layer of the invention may further include a superlattice structure, a graded layer structure, an insertion layer structure, or a combination of the above structures. As shown in FIG. 7D, the third nitride layer 700$d$ is formed by a superlattice structure 708 and the GaN layer 116, wherein the superlattice structure 708, such as the superlattice structure of AlN/AlGaN, may reduce vertical leakage current, thus facilitating the application of the semiconductor structure of the invention in a power element such as a high electron mobility transistor. The superlattice structure 708 may also adopt a graded layer structure, an insertion layer structure, or a combination of the above structures.

Based on the above, the semiconductor structure of the invention includes a substrate and a first nitride layer, a polarity inversion layer, a second nitride layer, and a third nitride layer formed thereon in sequence. Via the polarity inversion layer, the non-metallic polar surface of the first nitride layer in the semiconductor structure is converted into the metallic polar surface of the polarity inversion layer, and therefore the flatness of the subsequently-grown nitride layer may be improved. Moreover, if $Al_{1-x}Si_xN$ is used as the first nitride, the effects of suppressing parasitic channels and avoiding surface deterioration may be achieved by adjusting the aluminum content. In addition, the second nitride layer formed by the low-temperature aluminum nitride layer and the high-temperature aluminum nitride layer may suppress interface carrier concentration and reduce insertion loss. The semiconductor structure of the invention may be used in the field of semiconductor epitaxy, and the gallium nitride on silicon (GaN on Si) produced by the invention may be applied to a radio-frequency (RF) element.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A semiconductor structure, comprising:
a substrate;
a first nitride layer formed on the substrate;
a polarity inversion layer formed at a surface of the first nitride layer to convert a non-metallic polar surface of the first nitride layer into a metallic polar surface of the polarity inversion layer;
a second nitride layer formed on the polarity inversion layer; and
a third nitride layer formed on the second nitride layer.

2. The semiconductor structure of claim 1, wherein a thickness of the polarity inversion layer less than 1 nm.

3. The semiconductor structure of claim 1, wherein a material of the polarity inversion layer comprises silicon or a metal.

4. The semiconductor structure of claim 1, wherein the first nitride layer is $Al_{1-x}Si_xN$, and $0<x\leq1$.

5. The semiconductor structure of claim 4, wherein an aluminum content in the first nitride layer is gradually increased from the substrate toward the polarity inversion layer.

6. The semiconductor structure of claim 1, wherein a thickness of the first nitride layer is between 0.1 nm and 5 nm.

7. The semiconductor structure of claim 1, wherein a surface roughness the first nitride layer is Rms<0.6 nm.

8. The semiconductor structure of claim 1, wherein the second nitride layer is single-layer or multi-layer AlN.

9. The semiconductor structure of claim 8, wherein the multi-layer AlN comprises a low-temperature aluminum nitride layer formed on the polarity inversion layer and a high-temperature aluminum nitride layer between the low-temperature aluminum nitride layer and the third nitride layer, and a temperature difference between a growth temperature of the high-temperature aluminum nitride layer and a growth temperature of the low-temperature aluminum nitride layer is greater than 50° C.

10. The semiconductor structure of claim 9, wherein a thickness of the second nitride layer is 100 nm or less, and a thickness of the low-temperature aluminum nitride layer is less than a thickness of the high-temperature aluminum nitride layer.

11. The semiconductor structure of claim 1, wherein the third nitride layer comprises a multi-layer structure.

12. The semiconductor structure of claim 11, wherein the third nitride layer comprises all combinations of $Al_{1-x}Ga_zN$ and AlN and GaN, and $0<z\leq1$.

13. The semiconductor structure of claim 11, wherein the third nitride layer comprises: a superlattice structure, a graded layer structure, an insertion layer structure, or a combination of the above.

14. The semiconductor structure of claim 11, wherein a thickness of the third nitride layer is between 0.1 μm and 10 μm.

15. The semiconductor structure of claim 1, wherein a carrier concentration in a surface of the substrate is $10^{15}/cm^3$ or less.

16. The semiconductor structure of claim 15, wherein a carrier diffusion depth in the surface of the substrate is less than 0.5 μm.

17. The semiconductor structure of claim 1, wherein a resulting insertion loss is less than −0.5 dB.

18. The semiconductor structure of claim 1, wherein the substrate has a resistivity of 1,000 ohm-cm to 10,000 ohm-cm.

* * * * *